United States Patent
Lewis

(10) Patent No.: US 7,693,496 B2
(45) Date of Patent: Apr. 6, 2010

(54) POLAR TRANSMITTER ARRANGEMENT AND METHOD

(75) Inventor: Michael Lewis, Märsta (SE)

(73) Assignee: Infineon Technologies AG, Munich (DE)

( * ) Notice: Subject to any disclaimer, the term of this patent is extended or adjusted under 35 U.S.C. 154(b) by 736 days.

(21) Appl. No.: 11/516,947

(22) Filed: Sep. 7, 2006

(65) Prior Publication Data

US 2008/0064343 A1 Mar. 13, 2008

(51) Int. Cl.
*H03C 5/00* (2006.01)

(52) U.S. Cl. .......................... 455/108; 455/91; 455/110

(58) Field of Classification Search .................. 455/23, 455/102, 114.3, 91, 126; 348/442
See application file for complete search history.

(56) References Cited

U.S. PATENT DOCUMENTS

| | | | |
|---|---|---|---|
| 7,109,816 B2* | 9/2006 | Khlat | 332/112 |
| 7,276,985 B2* | 10/2007 | Hirano | 332/128 |
| 7,333,780 B2* | 2/2008 | Udagawa et al. | 455/126 |
| 7,358,829 B2* | 4/2008 | Oka | 455/127.1 |
| 7,363,014 B2* | 4/2008 | Nakamura et al. | 455/127.3 |
| 7,378,918 B2* | 5/2008 | Hirano et al. | 455/110 |
| 7,379,715 B2* | 5/2008 | Udagawa et al. | 455/126 |
| 2003/0206056 A1* | 11/2003 | Hietala | 330/100 |
| 2003/0206058 A1* | 11/2003 | Paul et al. | 330/251 |
| 2006/0178120 A1* | 8/2006 | Puma | 455/114.3 |
| 2006/0229036 A1* | 10/2006 | Muller et al. | 455/114.3 |
| 2006/0234652 A1* | 10/2006 | Oka | 455/102 |
| 2007/0142000 A1* | 6/2007 | Herzinger | 455/91 |
| 2007/0149148 A1* | 6/2007 | Yoshikawa et al. | 455/110 |
| 2008/0026706 A1* | 1/2008 | Shimizu et al. | 455/108 |
| 2009/0060089 A1* | 3/2009 | Matsuura et al. | 375/300 |

* cited by examiner

*Primary Examiner*—Matthew D Anderson
*Assistant Examiner*—Gennadiy Tsvey
(74) *Attorney, Agent, or Firm*—Eschweiler & Associates, LLC

(57) ABSTRACT

A transmitter arrangement, a polar modulator arrangement, a polar modulation method and a polar transmitter arrangement are disclosed. A polar modulator arrangement includes a polar generator to provide a phase component and an amplitude component of a complex signal, a filtering block to filter the phase component, and a combiner to combine the amplitude component and the filtered phase component.

17 Claims, 4 Drawing Sheets

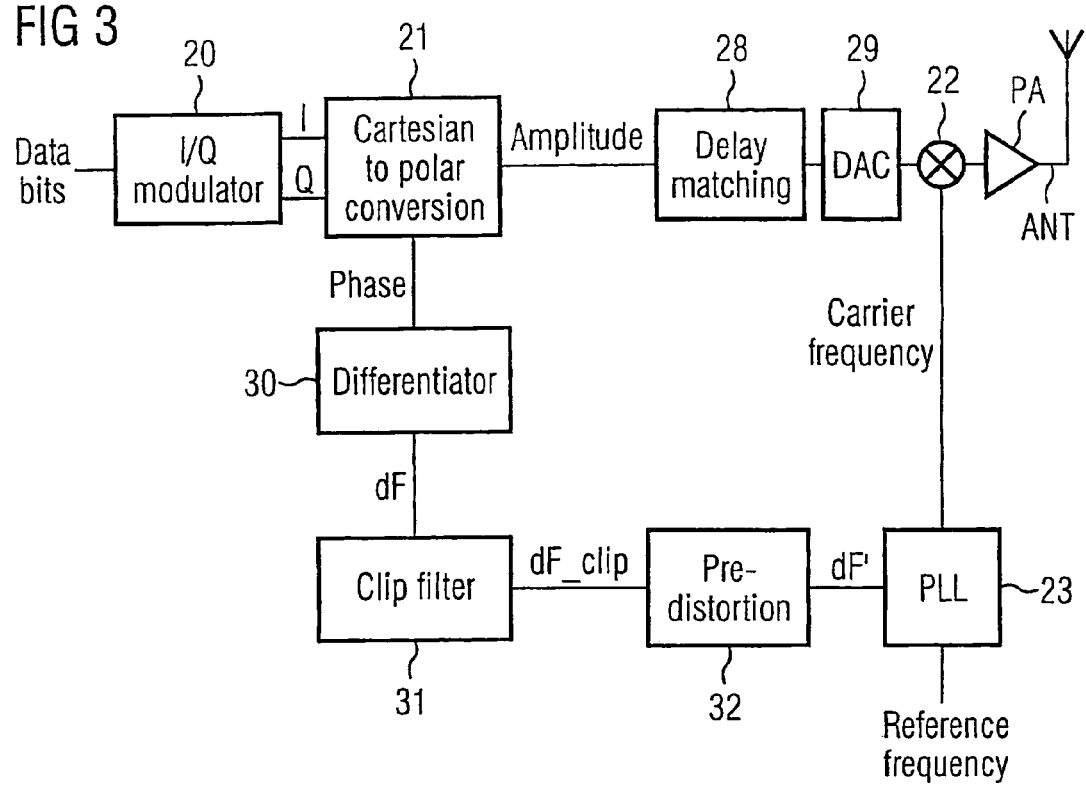
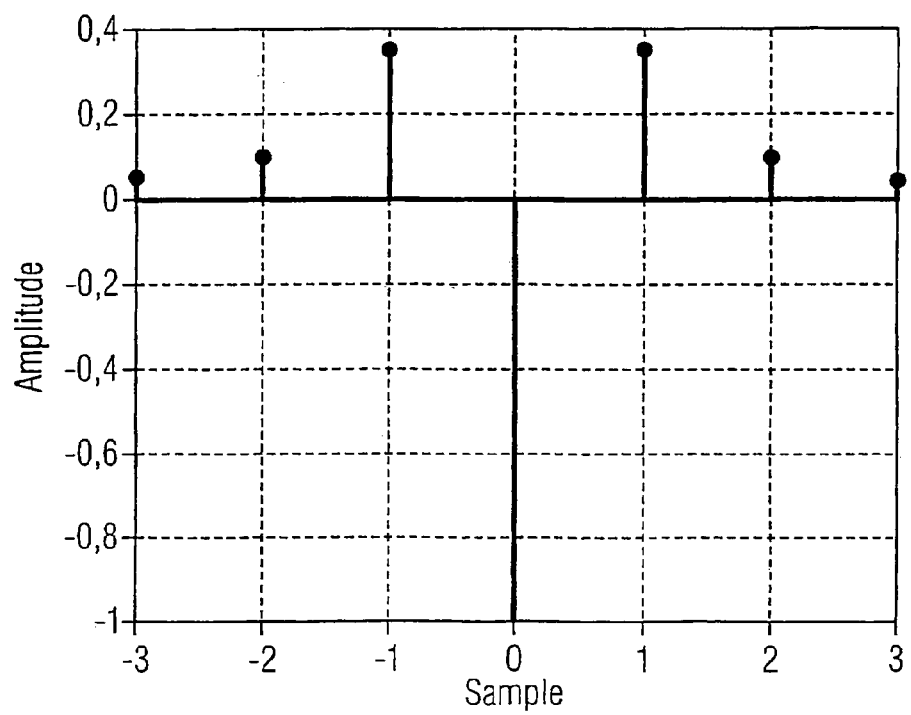

POLAR TRANSMITTER ARRANGEMENT AND METHOD

FIELD OF THE INVENTION

The invention relates to a transmitter arrangement, a polar modulator arrangement and a polar transmitter arrangement. The invention further relates to a polar modulation method.

BACKGROUND OF THE INVENTION

In modern transmitter arrangements, complex signal processing is widely used. A complex signal can be represented by an in-phase component I and a quadrature component Q. This is normally referred to as Cartesian representation. I and Q signals are separated by a phase of 90°. However, when applied in a transmitter in the digital communications field, a conventional modulator needs two carrier signals, namely of 90° phase difference but at the same frequency. These multiplied signals are summed together and passed to the output driver. A resulting signal has a continually variable amplitude and phase.

However, a complex signal can also be represented by amplitude and phase. This is also referred to as polar representation. In a polar modulator, the amplitude can directly be used to control the output amplitude, typically by converting the amplitude to an analogue value which drives a mixer. Phase information can be used to control a frequency synthesizer such that a phase of a generated carrier signal tracks the desired phase.

Polar modulation offers a potential for reduced complexity and current consumption in the modulator path, removing the requirement to generate separate I and Q carrier signals, eliminating the problem of image rejection and making frequency synthesis more robust by allowing the oscillator to operate at the same frequency as the carrier frequency or an integer multiple thereof. Moreover, since more and more functionality can be implemented in the digital domain instead of the analogue domain, the polar modulation concept is more suitable for implementation in advanced, complementary metal oxide semiconductor (CMOS) processing technologies.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present one or more concepts of the invention in a simplified form as a prelude to the more detailed description that is presented later.

According to an exemplary embodiment of a polar modulator arrangement of the present invention, the polar modulator arrangement comprises a polar generator, a combiner and a filtering block. The polar generator provides a phase component and an amplitude component of a complex signal. The filtering block filters the phase component. A combination of the amplitude component and the filtered phase component is performed by the combiner.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

The text below explains embodiments of the invention in detail using exemplary embodiments with reference to the drawings in which FIG. 3 is a block diagram illustrating a further exemplary embodiment of a modulator arrangement, FIG. 4 is a graph illustrating an exemplary embodiment of a clip filter.

DETAILED DESCRIPTION OF THE INVENTION

Figure 1:
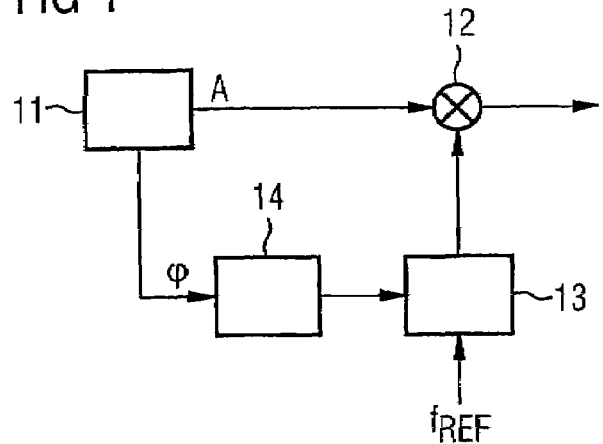
FIG. 1 is a block diagram illustrating an exemplary embodiment of a modulator arrangement.

FIG. 1 shows an exemplary embodiment of a polar modulator arrangement. The polar generator 11 has a first output providing an amplitude component A and a second output providing a phase component $\phi$. The second output of the polar generator is coupled to an input of a filtering block 14. An output of the filtering block 14 is coupled to an input of the combiner 12, 13. The first output of the polar generator which provides the amplitude component is also coupled to an input of the combiner 12, 13. At an output of the combiner, a combined, modulated signal is provided.

Further according to the exemplary embodiment shown in FIG. 1, the combiner comprises a mixer 12 and a synthesizer 13. In the embodiment, the synthesizer is designed as a phase-locked loop (PLL). However, other kinds of synthesizers can be used according to the invention.

The synthesizer 13 has an output which is coupled to a first input of the mixer 12. A second input of the mixer 12 is coupled, directly or indirectly, to the first output of the polar generator 11. A first input of the synthesizer 13 is coupled to the output of the filtering block 14. A second input of the synthesizer 13 receives a reference frequency.

The polar generator 11 according to FIG. 1 provides a polar representation of a complex signal having an amplitude component A and a phase component $\phi$. The amplitude is directly used to control the output amplitude. The phase information is used to control the frequency synthesizer such that the phase of the generated carrier signal tracks the desired phase. The filtering block according to FIG. 1 preprocesses the phase implementation in such a way that the dynamics of the differentiated phase are substantially reduced.

According to an embodiment of the invention, the phase bandwidth can be limited. PLL dynamics can be reduced.

By doing this, the slew rate in the PLL control, for example a large charge pump current, can be reduced.

According to an embodiment of the invention, the filtering block 14 filters a phase information of the phase component such that a phase deviation required to cross the origin of a phasor trajectory in an I-Q diagram is already started before the origin crossing occurs.

This results in a reduction of both the magnitude of the frequency deviation and the high-frequency content.

According to an embodiment, the transmitted signal phasor is distorted somewhat from the ideal signal phasor as it passes near the origin. However, the effect on the error vector magnitude is small according to this embodiment.

According to an embodiment, the error vector magnitude is integrated over an entire bit period, and the amplitude of the signal is small at the time that the distortion has the greatest impact.

According to an embodiment, the filtering block 14 comprises a low-pass filter.

The low-pass filter causes, according to this embodiment, abrupt phase changes to be smoothed out, while allowing the phase to settle on the correct value over the course of a symbol period.

According to an embodiment, the filtering block 14 comprises a look-up table.

Amplitude and/or frequency deviations that would be generated for particular sequences of input bits can be pre-calculated. The pre-calculated information can be stored in a look-up table. When, during operation, the particular signal sequence occurs, then the pre-calculated information can be used for further processing.

In a digital communication system, it is possible to pre-calculate the information for any possible bit sequence of input bits.

According to an embodiment, the filtering block 14 comprises a pre-distortion. For example, a pre-distortion function can be used to generate compensated frequency deviations. In an embodiment, the pre-distortion compensates for a low-pass response of the synthesizer. For example, the compensation can be done by pre-emphasizing higher frequencies.

The filtering block comprises, according to one embodiment, a differentiator. The differentiator can be used to differentiate the phase information, thus providing frequency deviations. Frequency is the derivative of phase. The phase signal can be differentiated to generate corresponding frequency deviations which, when applied to the carrier signal, will recreate the wanted output phase.

The polar modulator arrangement according to FIG. 1 can be used, according to one embodiment, as a transmitter in a communication system. According to another embodiment, the polar modulator arrangement can be used in a mobile communication device. An antenna can be coupled, directly or indirectly, to the output of the mixer 12. For example, a power amplifier, an automatic gain control or alike can be provided in the signal path comprising the mixer 12 and the antenna.

The input data fed to an input of the polar generator 11 may comprise useful information like voice, audio, video or other information. The information may also comprise overhead information, for example setting parameters.

According to an embodiment, the polar modulator arrangement can be used for digital modulation techniques. For example, an 8-PSK, phase shift keying, can be performed. However, the invention is not limited to a certain modulation technique.

Figure 2:
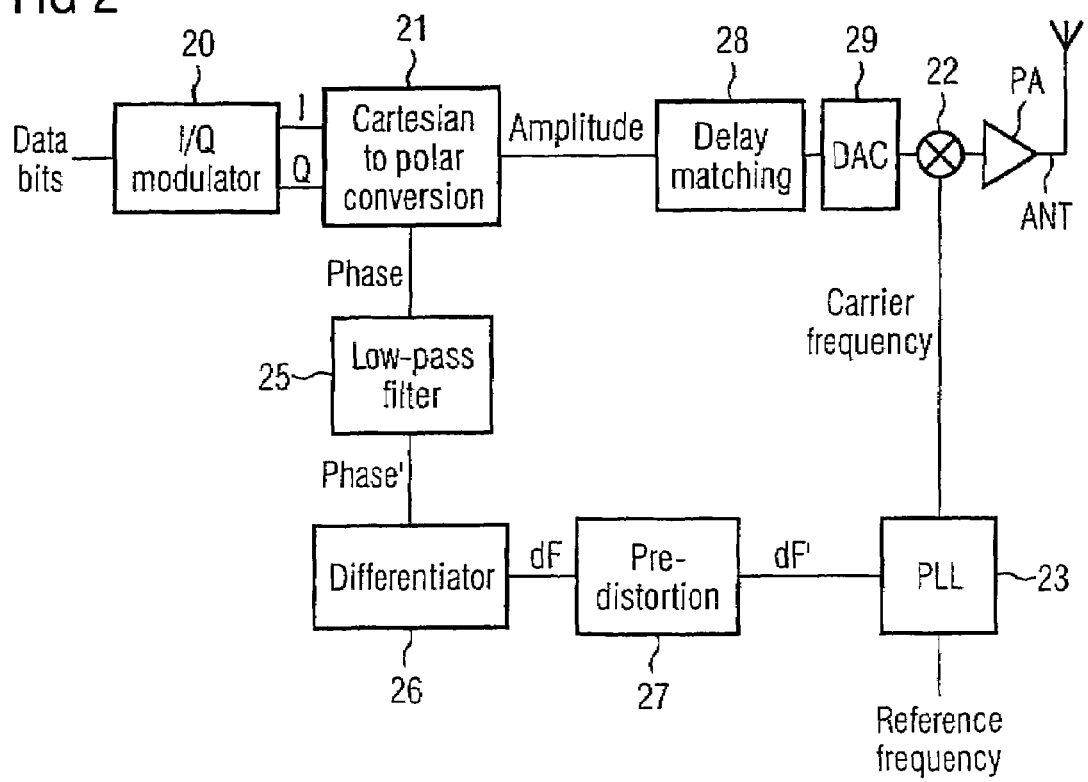
FIG. 2 is a block diagram illustrating another exemplary embodiment of a modulator arrangement.

FIG. 2 shows an exemplary embodiment of a transmitter arrangement. The transmitter arrangement according to FIG. 2 comprises a signal generator (I/Q modulator, Cartesian-to-polar converter) 20, 21 for providing a complex signal having an amplitude component and a phase component. A frequency converter 22 is coupled, with one of its inputs directly or indirectly to an output of the signal generator 20, 21. A further input of the frequency converter is connected to an output of a synthesizer 23. A signal processor (low-pass filter, differentiator, pre-distorter) 25, 26, 27 for processing the phase component is coupled between the signal generator 20, 21 and the synthesizer. The signal processor comprises a filter.

According to one embodiment, the filter comprises a low-pass filter 25. The signal processor further comprises, according to one embodiment, a pre-distortion function 27. The signal processor may further comprise a differentiator 26.

According to an embodiment, the differentiator is connected downstream of the low-pass filter 25. A pre-distortion block 27 is coupled, according to an embodiment, between the differentiator 26 and the synthesizer 23.

According to one embodiment, the low-pass filter 25 filters the phase component according to a low-pass characteristic, providing a filtered phase.

The differentiator 26 provides, according an embodiment, a differentiated phase. The differentiator may provide a frequency deviation.

The frequency deviation may be pre-distorted by the pre-distortion block 27, generating compensated frequency deviations.

According to an embodiment, the timing of the amplitude and phase-frequency components is matched such that the delays in the amplitude and phase paths are substantially equal.

According to an embodiment, a delay matching circuit 28 is coupled between an output of the signal generator 20, 21 and an input of the frequency converter 22. Between the delay matching block 28 and the frequency converter input, a digital-to-analogue converter (DAC) 29 may be disposed.

The signal generator 20, 21 may comprise an IQ modulator 20, to which a Cartesian-to-polar conversion circuit 21 is coupled. While the IQ modulator 20 provides a complex signal having an in-phase component I and a quadrature component Q, the Cartesian-to-polar conversion provides an amplitude component and a phase component according to a polar representation.

According to an embodiment, the synthesizer 23 comprises a phase-locked loop circuit. The synthesizer may have an input for providing a reference frequency. An output of the PLL can be used to provide a carrier frequency which is phase/frequency modulated.

The frequency converter 22 may comprise a frequency mixer. To the output of the frequency converter 22, an antenna ANT may be coupled, for example, via a power amplifier PA.

The low-pass filter causes abrupt phase changes to be smoothed out, while allowing the phase to settle on a correct value over the course of a symbol period.

The transmitter arrangement may be applicable but is not limited to Bluetooth systems. In an example of a Bluetooth enhanced data rate transceiver, which has a symbol rate of 1 MHz, it is possible to more than half the peak frequency deviation and reduce the required rate of change of frequency deviation, thereby relaxing the requirements on the PLL.

In different embodiments, the low-pass filter operation can advantageously be combined with the differentiation operation.

Alternatively or additionally, the low-pass filter operation can be combined with the pre-distortion function, depending on the application.

The signal processor comprising the low-pass filter function 25, the differentiation function 26 and the pre-distortion function 27, may be a digital processor. The synthesizer 23 may be partially or totally a digital PLL, DPLL.

According to an alternative embodiment, a polar transmitter arrangement is provided comprising a polar generator, a low-pass filter connected to an output of the polar generator, a phase-locked loop connected to an output of the low-pass filter, and a mixer comprising a first input connected to an output phase-locked loop and comprising a second input connected to the polar generator, and comprising an output.

Between the low-pass filter and the PLL, a differentiator and/or pre-distorter may be coupled according to an embodiment.

Between the polar generator and the mixer, namely in the amplitude component path, a delay matching circuit and/or a digital-to-analogue converter (DAC) may be connected.

The PLL may have a reference frequency input.

To the output of the mixer, a polar amplifier and/or an antenna may be connected.

FIG. 3 shows another exemplary embodiment of a polar transmitter arrangement. According to FIG. 3, a clip filter 31 is used instead of the low-pass filter 25 in FIG. 2. Please note that apart from the signal processor 30, 31, 32 between Cartesian to polar conversion 21 and the PLL 23, the circuits of FIG. 2 and FIG. 3 are the same and the description thereof is not repeated here.

Between the clip filter 31 and the Cartesian to polar conversion 21, a phase differentiator 30 may be connected.

A pre-distortion block 32 may be connected between the clip filter 31 and the PLL 23 according to an embodiment.

The clip filter 31 may exhibit a non-linear filtering function. According to an embodiment, samples where the frequency deviation dF at the input of the clip filter 31 exceed a predefined limit are clipped to this limit. Any excess value of the frequency deviation dF will be redistributed to adjacent samples in that embodiment.

This may ensure that the total phase shift is unchanged by the clip filter operation.

For example, the redistribution can be performed with a kernel function chosen to give a low-pass characteristic to the resulting frequency deviation profile.

An example of such a filter function of a clip filter is discussed later with reference to FIG. 4.

Using a clip filter results in a restriction of the effects of the generated distortion to those values nearest critical samples, thereby reducing the impact of processing on the error vector magnitude and the signal spectrum.

According to an embodiment, the clip filtering process prevents the frequency deviations from exceeding a certain limit.

A corresponding method may comprise reading a block of input samples into a processing buffer, and if none of the samples in the buffer exceed the limit value, outputting the buffered samples and exiting the procedure. The method further comprises creating a vector of clip amplitudes from the buffer samples, which may comprise the amplitude by which each input sample exceeds the limit value, and convolving the vector of clip amplitudes with a kernel function, the kernel function redistributing the clip values over adjacent samples while preserving the total phase change. Finally, the method comprises adding the vector of convolved clip amplitudes to the processing buffer, and continuing from the step of outputting the buffered samples, and exiting.

In FIG. 4 an exemplary embodiment of a digital clip filter function is shown. As shown in FIG. 4, the center tap is equal to −1.0, while the sum of the other taps equals 1.0 in this example.

Thus, the excess amplitude in a clipped sample can be subtracted away and distributed to surrounding samples. In the long-term phase, no error may occur.

However, alternatively to the example of FIG. 4, different kernel profiles and limit values can be chosen to trade-off reduction of PLL dynamics against the extent of introduced error in the resulting signal.

According to one embodiment, the clipped samples are located in the middle of the block. This is typically the case if the block size and alignment are chosen such that transitions between symbols are located in the middle of the block. Traversals of the origin are likely to occur in the IQ diagram at those positions.

Figure 5:
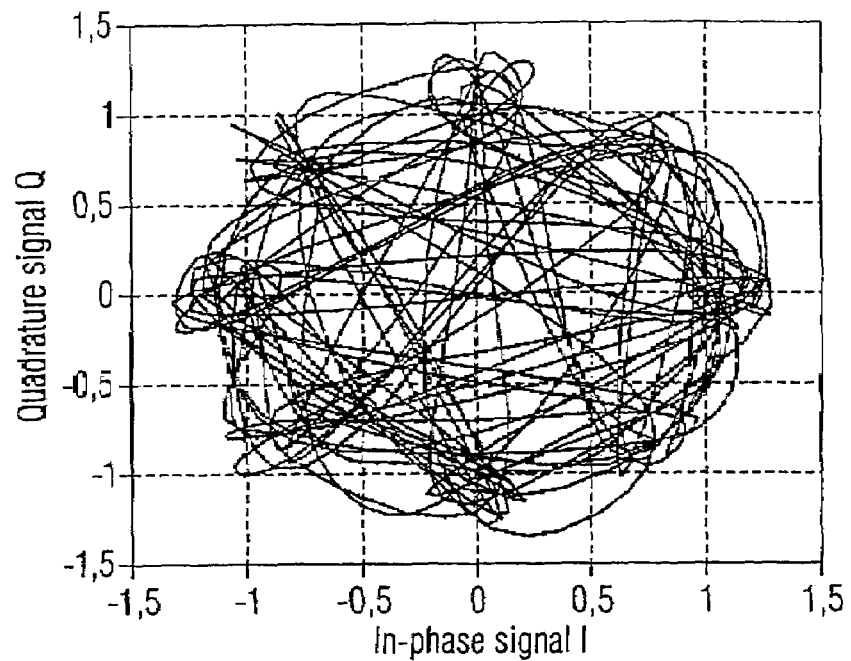
FIG. 5 is a graph illustrating a phasor trajectory for an 8-PSK signal.

FIG. 5 shows an example of an embodiment of an IQ diagram where the quadrature signal Q is shown over the in-phase signal I. The phase trajectory, namely examples of I-Q values, are shown for an 8-PSK signal. The constellation points are located at multiples of Pi/4 around the unit circle. The phasor follows a trajectory between these points depending on the sequence of input bits and the transmit filtering.

Please note, however, that embodiments of the invention are not limited to an 8-PSK modulation but can be applied to other modulation types as well.

Figure 6:
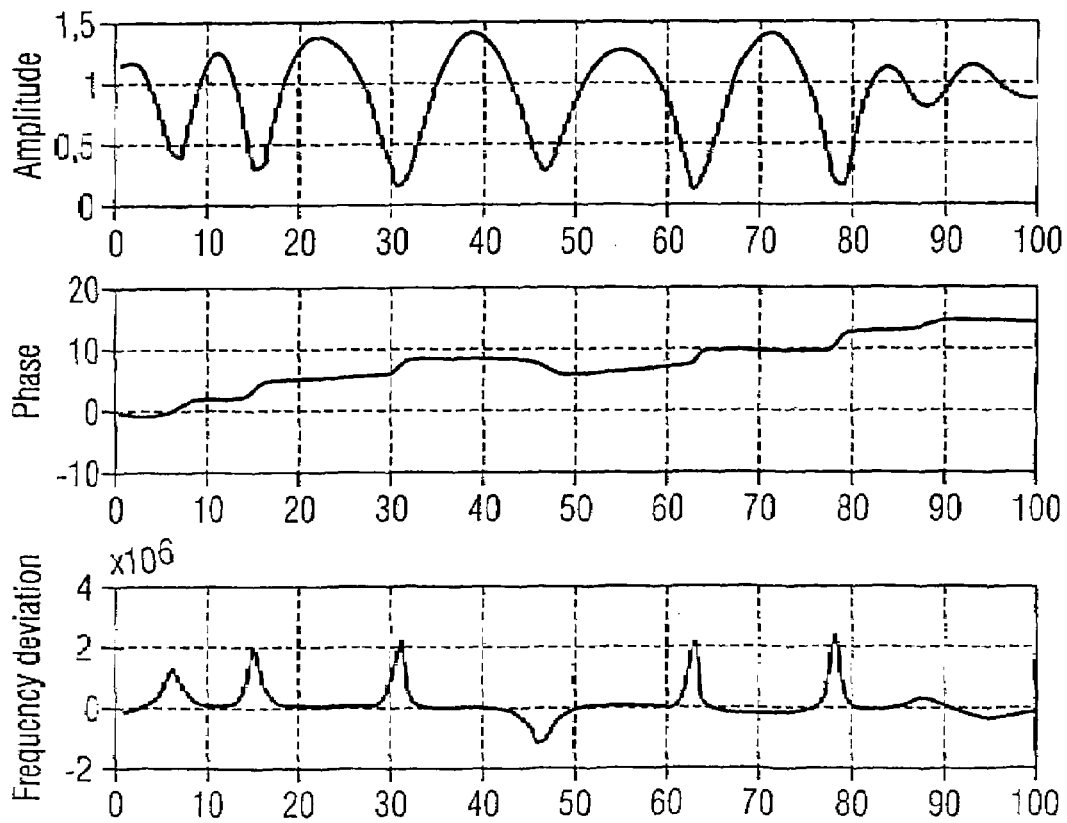
FIG. 6 illustrates a number of graphs showing an example of amplitude, phase and frequency deviation diagrams of a conventional modulator.

FIG. 6 shows amplitude and unwrapped phase information together with the corresponding frequency deviations corresponding to FIG. 5 at an example of a conventional polar modulation system.

It can be seen, that the dynamic range of the frequency deviations is relatively high. Large peaks corresponding to phase reversals occurring when the signal crosses near the origin occur. These peaks have large high-frequency content. When applying a pre-distortion function, this large high-frequency content would be amplified even further. This in turn requires a relatively high slew rate in a subsequent PLL control, for example resulting in large charge-pump currents. If the PLL cannot meet the required slew rate, then the accumulated change in phase will not be as required, thereby generating an error vector in the transmitted signal that may degrade system performance. This may result in a difficult trade-off between PLL bandwidth, spectral mask and error vector magnitude.

Figure 7:
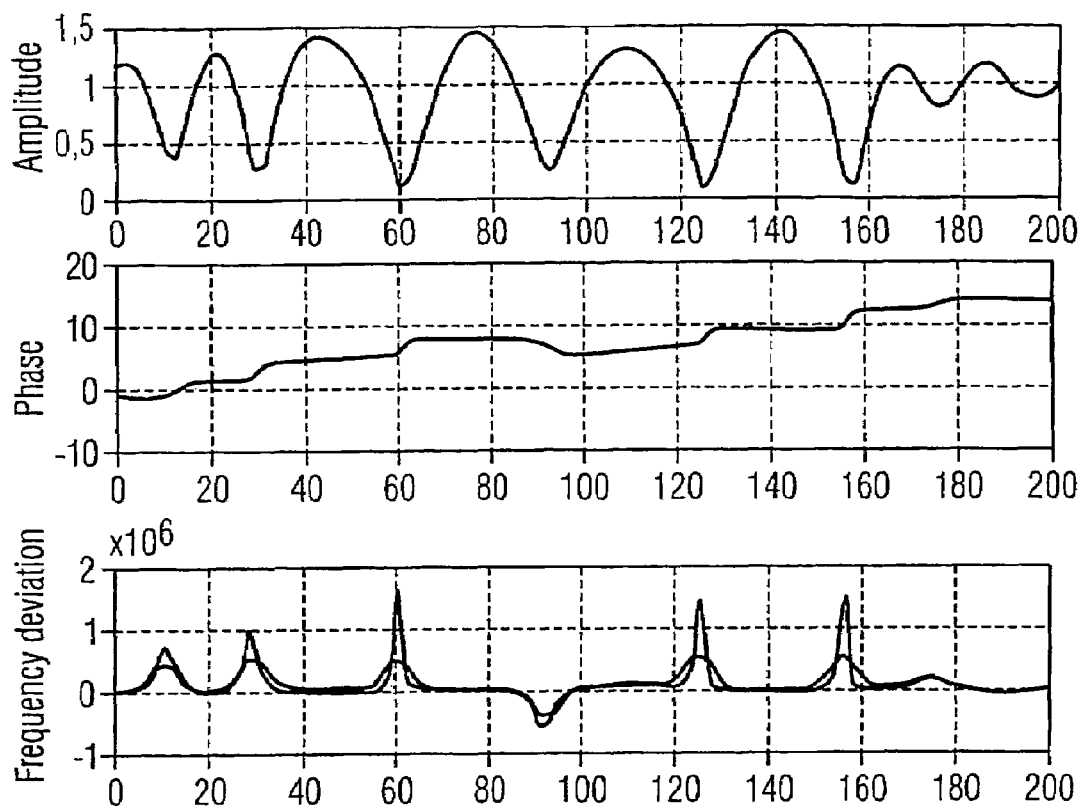
FIG. 7 illustrates a number of graphs showing an exemplary embodiment of amplitude, phase and frequency deviation diagrams according to the invention.

FIG. 7 shows the amplitude, phase and frequency deviation example diagrams of FIG. 6 but also a comparison to signals occurring when using, for example, the circuit according to the invention of FIG. 2. The filter function according to the example of FIG. 2 causes abrupt phase changes to be smoothed out, while allowing the phase to settle on the correct value over the course of for example one symbol period.

The frequency deviation peaks are significantly reduced as shown in FIG. 7.

The dynamic range of the frequency deviations is reduced. The large peaks corresponding to the phase reversals that occur when the signal crosses near the origin are reduced. This means that also the high-frequency content of the peaks is reduced. This in turn allows for a reduced slew rate in the PLL control for example a reduced charge-pump current.

The trade-off between PLL bandwidth, spectral mask and error vector magnitude is made significantly easier according to an embodiment.

Figure 8:
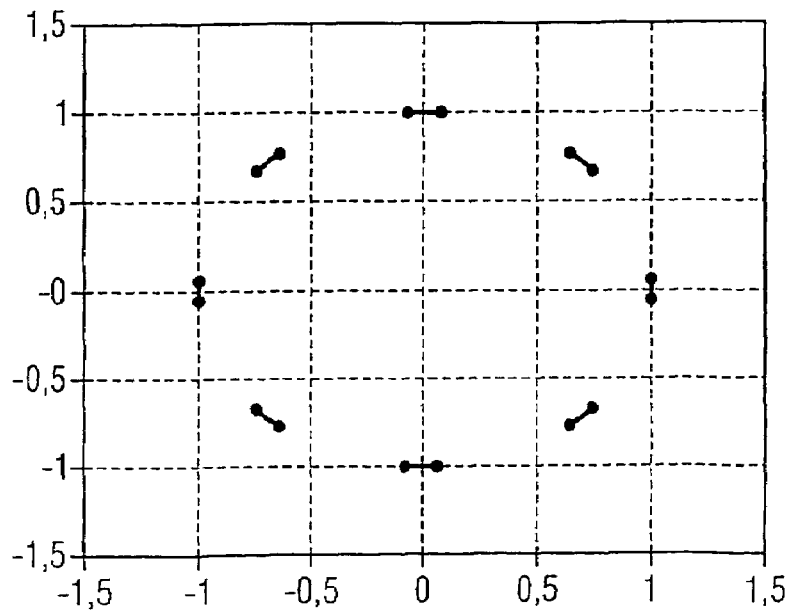
FIG. 8 is a graph illustrating an IQ diagram of an exemplary embodiment of an 8-PSK signal according to the invention.

FIG. 8 shows an embodiment of the IQ diagram of an 8-PSK modulation. Please note that the low-pass filtering of FIG. 3 results in only very slightly increased spur levels and only very slightly in error vector magnitude. The original and filtered constellations at the detector are shown in FIG. 8 as an example.

According to an embodiment, a transmitter arrangement is provided, comprising a signal generator for providing a complex signal having an amplitude component and a phase component, a frequency converter for providing a radio-frequency signal, the frequency converter comprising a first input coupled to the signal generator and comprising a second input, a synthesizer having an output coupled to the second input of the frequency converter, and a signal processor for processing the phase component, the signal processor coupled between the signal generator and the synthesizer, the signal processor comprising a filter.

According to another embodiment, a polar modulator arrangement comprises a polar generator providing a phase component and an amplitude component of a complex signal, a filtering block for filtering the phase component, and a combiner for combining the amplitude component and the filtered phase component.

In yet another embodiment, a polar transmitter arrangement comprises a polar generator, a low-pass filter connected to an output of the polar generator, a phase-locked loop connected to an output of the low-pass filter, and a mixer comprising a first input connected to an output of the phase-locked loop, comprising a second input connected to the polar generator, and comprising an output.

According to another embodiment, a polar modulation method comprises providing a phase component and an amplitude component of a signal, filtering the phase component such that the phase deviation required to cross the origin of the phasor trajectory in an I-Q diagram is already started before the origin crossing occurs, and combining the filtered phase component with the amplitude component.

According to an embodiment, the signal processor is operable to reduce a maximum rate of change of the carrier frequency.

According to an embodiment, the signal processor is operable to limit a maximum rate of change of the carrier frequency.

Although specific embodiments have been illustrated and described herein, it will be appreciated by those of ordinary skill in the art, that any arrangement which is calculated to achieve the same purpose may be substituted for the specific embodiments shown. It is to be understood, that the above description is intended to be illustrative and not restrictive. This application is intended to cover any adaptations or variations of the invention. Combinations of the above embodiments and many other embodiments will be apparent to those of skill in the art upon reading and understanding the above description. The scope of the invention includes any other embodiments and applications in which the above structures and methods may be used. The scope of the invention should, therefore, be determined with reference to the appended claims along with the scope of equivalents to which such claims are entitled.

It is emphasized that the Abstract is provided to comply with 37 C.F.R. 1.72(b) requiring an abstract that will allow the reader to quickly ascertain the nature and gist of the technical disclosure. It is submitted with the understanding, that it will not be used to interpret or limit the scope or meaning of the claims.

What is claimed is:

1. A transmitter arrangement, comprising:
   a signal generator configured to generate a complex signal having an amplitude component and a phase component;
   a frequency converter configured to generate a radio-frequency signal, the frequency converter comprising a first input coupled to the signal generator and receiving the amplitude component thereat, and comprising a second input;
   a synthesizer configured to generate a carrier frequency based on the phase component, the synthesizer having an output coupled to the second input of the frequency converter; and
   a signal processor coupled between the signal generator and the synthesizer, and configured to process the phase component, wherein the signal processor comprises a clip filter configured to clip a frequency deviation of the phase component or a signal associated therewith if the frequency deviation exceeds a predetermined limit value.

2. The transmitter arrangement of claim 1, wherein the signal processor further comprises a pre-distorter.

3. The transmitter arrangement of claim 1, wherein the signal processor further comprises a differentiator configured to differentiate the phase component or a signal derived therefrom.

4. The transmitter arrangement of claim 1, wherein the signal processor further comprises a look-up table configured to store pre-processed phase or frequency information.

5. The transmitter arrangement of claim 1, wherein a signal path between the signal generator and the frequency converter comprises a delay block.

6. The transmitter arrangement of claim 1, wherein a signal path between the signal generator and the frequency converter comprises a digital-to-analog converter.

7. A polar modulator arrangement, comprising:
   a polar generator configured to generate a phase component and an amplitude component of a complex signal;
   a filtering block configured to filter the phase component; and
   a combiner configured to combine the amplitude component and the filtered phase component,
   wherein the filtering block comprises a clip filter configured to clip a frequency deviation of the phase component or a signal associated therewith if the frequency deviation exceeds a predetermined limit value.

8. The polar modulator arrangement of claim 7, wherein the filtering block further comprises a pre-distorter.

9. The polar modulator arrangement of claim 7, wherein the filtering block further comprises a differentiator.

10. The polar modulator arrangement of claim 7, wherein the combiner comprises a mixer.

11. A polar transmitter arrangement, comprising:
    a polar generator;
    a filter coupled to an output of the polar generator, and configured to filter a phase component of a complex signal generated by the polar generator;
    a phase-locked loop coupled to an output of the filter, and configured to generate a modulated carrier signal based on the filtered phase component; and
    a mixer comprising a first input coupled to an output of the phase-locked loop, a second input coupled to the polar generator, and an output, and configured to combine an amplitude component from the polar generator and the modulated carrier signal from the phase-locked loop,
    wherein the filter comprises a clip filter configured to clip a frequency deviation of the phase component or a signal associated therewith if the frequency deviation exceeds a predetermined limit value.

12. The polar transmitter arrangement of claim 11, further comprising a differentiator coupled between the filter and the phase-locked loop.

13. The polar transmitter arrangement of claim 11, further comprising a pre-distortion block coupled between the filter and the phase-locked loop.

14. The polar transmitter arrangement of claim 11, further comprising a delay block coupled between the polar generator and the mixer.

15. The polar transmitter arrangement of claim 11, further comprising a digital-to-analog converter coupled between the polar generator and the mixer.

16. The polar transmitter arrangement of claim 11, wherein the polar generator comprises an I/Q input and a cartesian-to-polar converter, and is configured to generate the complex signal based on I and Q input signals.

17. The polar transmitter arrangement of claim 11, wherein the phase-locked loop has a reference frequency input operable to provide a carrier frequency signal.

* * * * *